United States Patent [19]

Burzio

[11] Patent Number: 5,686,849
[45] Date of Patent: Nov. 11, 1997

[54] CIRCUIT FOR CLOCK SIGNAL EXTRACTION FROM A HIGH SPEED DATA STREAM

[75] Inventor: Marco Burzio, Grugliasco, Italy

[73] Assignee: Cselt Centro Studi E Laboratori Telecomunicazioni S.p.A., Torino, Italy

[21] Appl. No.: 605,393

[22] Filed: Feb. 22, 1996

[30] Foreign Application Priority Data

Mar. 14, 1995 [IT] Italy .................. TO95A0190

[51] Int. Cl.$^6$ .................................................. H03L 7/087
[52] U.S. Cl. .......................... 327/165; 327/147; 327/156; 327/162; 33/11
[58] Field of Search .................. 327/144, 145–148, 327/155–157, 162, 165, 166, 178, 243–245, 299; 331/10, 11

[56] References Cited

U.S. PATENT DOCUMENTS

| | | | |
|---|---|---|---|
| 4,069,462 | 1/1978 | Dunn | 331/11 |
| 4,272,729 | 6/1981 | Riley, Jr. | 331/11 |
| 4,365,211 | 12/1982 | Lee | 331/11 |
| 4,787,097 | 11/1988 | Rizzo | 331/11 |
| 5,015,970 | 5/1991 | Williams et al. | 331/11 |
| 5,157,355 | 10/1992 | Shikakura et al. | 331/11 |
| 5,525,935 | 6/1996 | Joo et al. | 331/11 |

*Primary Examiner*—Timothy P. Callahan
*Assistant Examiner*—T. Lam
*Attorney, Agent, or Firm*—Herbert Dubno

[57] ABSTRACT

The circuit for clock signal extraction from a high speed data stream which allows a rapid attainment of the identity between the frequencies of the locally generated clock signal and of the data signal, even when such frequencies are very different. The circuit can easily be inserted into a more complex CMOS digital integrated circuit, it has low power dissipation and is capable of operating at bit rates exceeding 300 Mbit/s. The circuit has a main phase locked loop, which controls a voltage controlled oscillator by continually controlling its phase and a secondary loop, which allows the main loop to become locked, by causing the voltage controlled oscillator to oscillate at a frequency close to the operating frequency.

2 Claims, 4 Drawing Sheets

CIRCUIT FOR CLOCK SIGNAL EXTRACTION FROM A HIGH SPEED DATA STREAM

FIELD OF THE INVENTION

The present invention relates to apparatus for digital signal transmission between electronic systems located at some distance from one another and, more particularly, to a circuit for clock signal extraction from a high speed data stream.

BACKGROUND OF THE INVENTION

It is well known that to correctly detect a data signal, a receiving device must have at disposal a clock signal that is exactly synchronized with the incoming digital stream, so as to be able to evaluate the logic levels at the most favorable instants. However, not always is the data signal transmitted with an associated clock signal, in particular when transmission is performed serially on a single line. In this case, the clock signal for the detection must be recovered by extracting the necessary information from the data signal itself.

This operation is usually carried out by means of the known PLL (Phase Locked Loop) circuit, by using as a reference signal the digital signal incoming at the receiver to generate an output clock signal whose frequency is equal to the bit rate of the data signal. The reconstructed clock signal has a very well defined phase relationship with the data signal, so as to present the low to high level transitions in correspondence with the optimal sampling instant.

The main components of the phase locked loop are, as is well known, a phase detector, a filter and a Voltage Controlled Oscillator (VCO). The detector compares the phase of the data signal with that of the clock signal locally generated by the VCO and supplies an error signal which, through the filter, controls the VCO by continually controlling its phase.

One of the problems presented by such a circuit is that of frequency acquisition, i.e. of reaching the condition of identity between the clock signal frequency and the data signal frequency. Indeed, if the natural oscillating frequency of the VCO, which generates the clock signal, is very different, a loop so structured might never become locked or might take too long to do so.

To obviate this drawback, some solutions have been proposed which entail the introduction of an additional loop arranged to detect the frequency difference and to make the VCO oscillate in the vicinity of the desired frequency, making it possible for the phase detector to become locked.

One of these solutions, which utilizes a PLL circuit comprising a main and a secondary loop, is described in EP-A-0 658 995. In this case, the secondary loop uses a conventional phase and frequency detector.

An example of a frequency discriminator is described in the book "Phaselock Techniques" by Floyd M. Gardner, at pages 86–87. This solution is suitable for implementation by means of analog integrated circuits; however, it is difficult to implement a PLL in a CMOS digital integrated circuit with such a frequency discriminator.

SUMMARY OF THE INVENTION

The aforesaid drawbacks are obviated by the circuit for clock signal extraction from a high speed data stream, according to the present invention, which allows a quick attainment of the identity between the frequency of the locally generated clock signal and that of the data signal, even when such frequencies are very different. The circuit can easily be introduced into a more complex CMOS digital integrated circuit. This allows better engineering of printed circuit boards, since an external PLL circuit is no longer required. The circuit, if it is realized in CMOS technology, has low power dissipation and it is capable of operating at bit rates in excess of 300 Mbit/s.

More particularly, a circuit for the extraction of a clock signal from a high speed data stream can comprise:

a main phase locked loop, comprising of phase detector, a driven current generator, a filter and a voltage controlled oscillator, in which the phase detector compares the phase of a data signal with that of a locally generated clock signal and generates an error signal which, through the driven current generator and the filter, controls the voltage controlled oscillator by continually controlling its phase;

a secondary loop, which allows the main loop to become locked by bringing the voltage controlled oscillator to oscillate at a frequency close to an operating frequency, the secondary loop comprising a frequency detector, a threshold comparator and a driven current generator which feeds the filter, the frequency detector comprising:

a first divider which divides the locally generated clock signal;

a sampling block which synchronizes a signal supplied by the first divider with a reference signal;

a second divider which divides a signal supplied by the sampling block;

a first monostable circuit which generates output pulses of a duration determined on the basis of the reference signal and whose starting instant is determined by the transitions of a signal supplied by the second divider;

a second monostable circuit which generates output pulses of duration determined on the basis of the reference signal and whose starting instant is determined by the transitions of a signal supplied by the second divider;

a second monostable circuit which generates output pulses of a duration determined on the basis of the reference signal and whose starting instant is determined by the transitions of a signal obtained by inverting the signal supplied by the second divider;

a first AND gate which receives the signal supplied by the second divider and a complement of a signal supplied by the first monostable circuit;

a second AND gate which receives a complement of the signal supplied by the second divider and the signal supplied by the first monostable circuit;

a third AND gate which receives the complement of the signal supplied by the second divider and the complement of a signal supplied by the second monostable circuit;

a fourth AND gate which receives the signal supplied by the second divider and the signal supplied by the second monostable circuit;

a first OR gate which receives a signal supplied by the first AND gate and a signal supplied by the third AND gate and supplies pulses whose frequency and duration are proportional to a frequency error, when the frequency of the locally generated clock signal is lower than that of the reference signal; and a second OR gate which receives a signal supplied by the second AND gate and a signal supplied by the fourth AND gate and supplies pulses whose frequency and duration are proportional the frequency error, when the frequency of the locally generated clock signal is higher than that of the reference signal.

BRIEF DESCRIPTION OF THE DRAWING

These and other characteristics of the present invention shall be clarified better by the following description of a preferred embodiment, given solely by way of non-limiting example, and with reference to the accompanying drawing in which.

SPECIFIC DESCRIPTION

Figure 1:
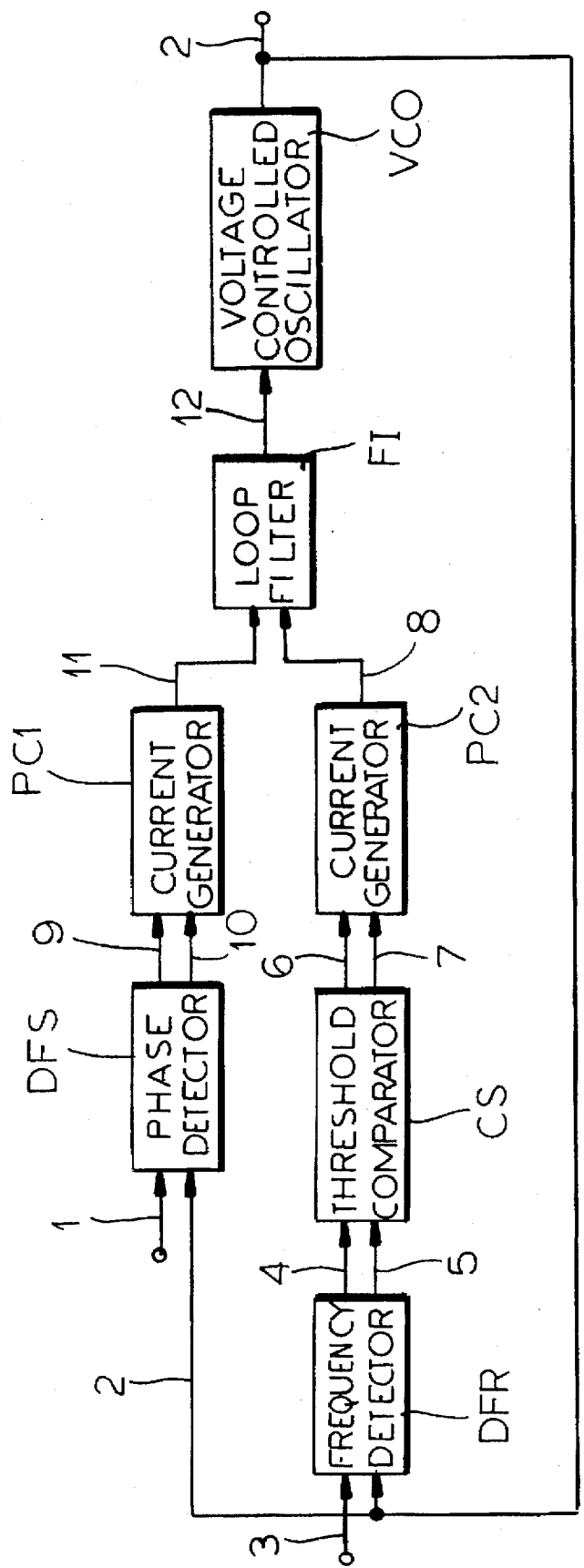
FIG. 1 is a block diagram of the clock signal extraction circuit.

The circuit for clock signal extraction from a high speed data stream, represented in the block diagram in FIG. 1, is based on a dual-loop PLL structure. The main loop, comprising a phase detector DFS, a driven current generator PC1, a loop filter FI and a voltage controlled oscillator VCO, provides for phase locking the clock signal generated by the VCO, present on wire 2, with the data incoming on wire 1.

The secondary loop, comprising a frequency detector DFR, a threshold comparator CS, a driven current generator PC2, filter FI and oscillator VCO, is to allow the main loop to become locked by bringing oscillator VCO to oscillate at a frequency close to the desired one.

Starting from the hypothesis that VCO oscillates at a frequency that is very different from the optimal one, which in the present example is equal to four times the reference frequency present on wire 3, frequency detector DFR provides error pulses on wire 4, if the frequency on wire 2 is too low, or on wire 5 if the frequency is too high.

The frequency of these pulses is proportional to the difference between the frequency present on wire 2 and four times the one present on wire 3; moreover, in the case of a large difference, for instance exceeding 25%, not only the frequency but also the duration of the pulses is proportional to that difference. The overall effect is to make the mean value of the error signal proportional to the frequency difference.

Threshold comparator CS operates in such a way as to let error pulses on wires 4 or 5 pass to wires 6 or 7, respectively, only if their frequency exceeds a pre-set value; otherwise comparator CS blocks the pulses.

Driven current generator PC2 supplies a pre-set amount of charge to filter FI in response to a pulse on wire 6, while it removes the same amount of charge in the presence of a pulse on wire 7. Filter FI, composed of a resistance-capacitance (RC) network, as a result varies the voltage on wire 12, which voltage controls the oscillating frequency of VCO and approximates it to the desired one.

When the oscillating frequency of the VCO enters the operation range of the main loop, the frequency of the pulses exiting DFR becomes lower than the threshold of comparator CS, which as a result prevents the propagation of additional pulses towards driven current generator PC2. Under these conditions, the secondary loop stops operating and control is assumed by the blocks forming the main loop.

The presence of threshold comparator CS allows the use of a local oscillator that is able to provide a reference signal with a frequency which may differ even up to 0.1% from the one associated with the incoming data, divided by four. Therefore, even a simple, not particularly accurate quartz crystal oscillator could be used, for example.

Phase detector DFS, which belongs to the main loop, compares the phase of the signal generated by VCO, present on wire 2, with that of the data signal received on wire 1 and supplies on one of wires 9 or 10 pulses of constant duration and on the other wire pulses whose duration depends on the phase error. The net current injected into filter FI by driven current generator PC1 by means of wire 11 is proportional to the difference in duration of the pulses on the two wires; the resulting voltage variation obtained at the output of filter FI on wire 12 causes a corresponding frequency variation of the signal on wire 2, which zeroes the phase error.

Figure 2:
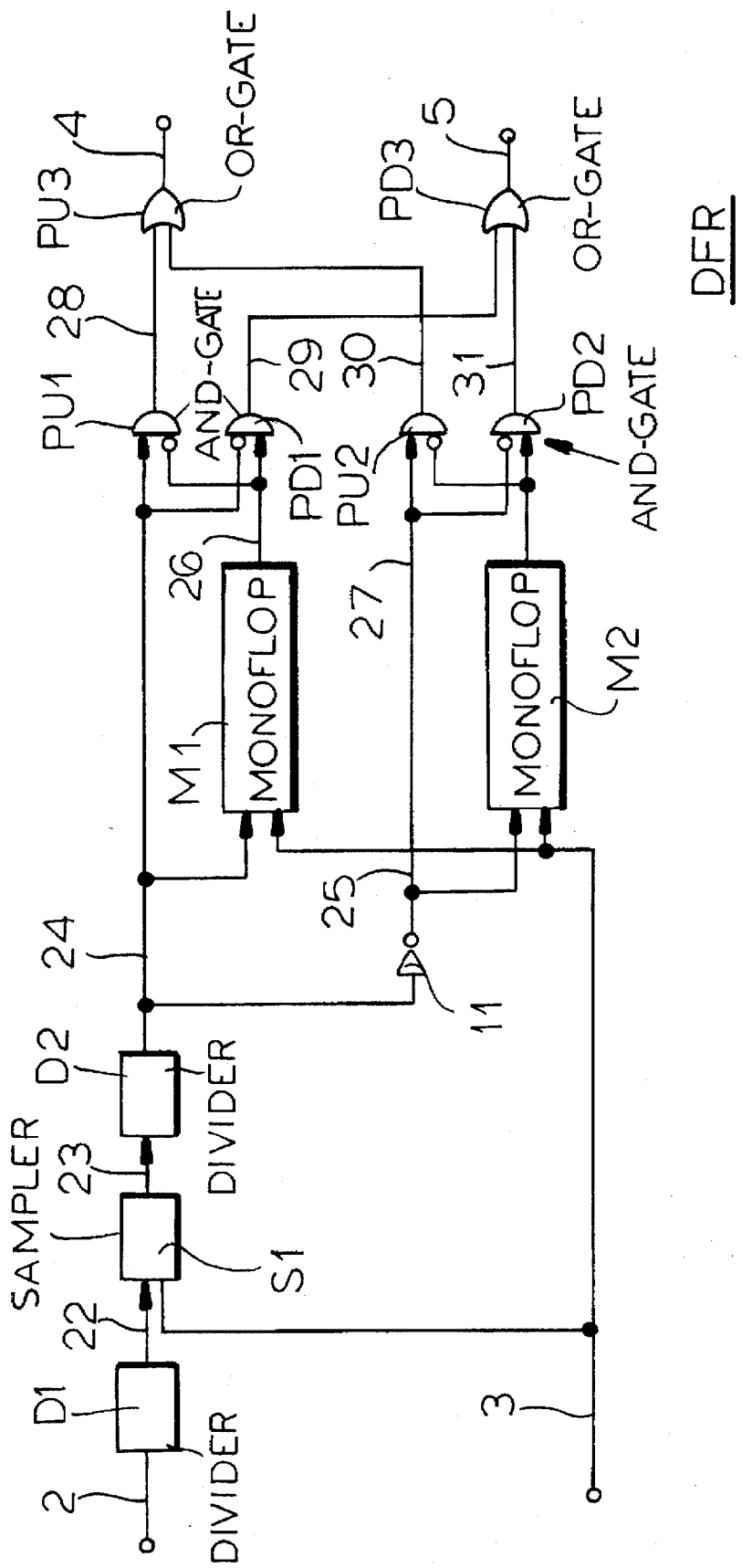
FIG. 2 is a block diagram of block DFR of FIG. 1.

Block DFR is represented in detail in the block diagram in FIG. 2.

Frequency detector DFR operates synchronously with the input reference signal present on wire 3, whose frequency is equal to a quarter of the one to be imposed on the signal present on wire 2. The choice of a quarter is linked with the particular embodiment, but by suitably adapting the modules forming the structure, the ratio of the input frequencies could have any value.

The frequency of the signal on wire 2 is divided by 16 by a divider D1, whose output signal on wire 22 is sampled by a sampling block S1, essentially comprising a flip-flop controlled by the signal on wire 3. The signal at the output of block S1 on wire 23, which is thus synchronised, is supplied to a subsequent divider D2, which divides said signal preferably by two, thereby supplying pulses at stable logic level on wire 24.

The purpose of blocks M1, PU1 and PD1 is to generate correction pulses starting from the measurement of the duration of logic level "1" on wire 24; the purpose of blocks M2, PU2, PD2 is to generate correction pulses starting from the measurement of the duration of logic level "1" on wire 25, which level corresponds to logic level "0" on wire 24, since an inverter I1 is interposed.

When wire 24 goes from logic level "0" to logic level "1", block M1, which consists of a monostable circuit, generates on wire 26 a pulse at logic level "1" of a duration equal to the duration the pulse on wire 24 should have if the oscillation frequency of VCO (FIG. 1) were the desired one. The duration of the pulse on wire 26 is determined on the basis of the reference signal on wire 3, while the beginning of the pulse is controlled by the signal on wire 24.

If the duration of logic level "1" on wire 24 is longer than that of the pulse on wire 26, then the oscillating frequency of the signal on wire 2 is too low. AND gate PU1, which receives at its inputs the signal on wire 24 and the complement of the signal on wire 26, detects this difference in duration supplying on wire 28 a pulse whose duration is equal to the difference itself. This latter pulse, arriving at wire 4 through OR gate PU3, contributes to raise the oscillation frequency of the signal on wire 2.

If the duration of logic level "1" on wire 24 is lower than that of the pulse on wire 26, then the oscillating frequency of the signal on wire 2 is too high. AND gate PD1, which receives at its inputs the complement of the signal on wire 24 and the signal on wire 26, detects this difference in duration, supplying on wire 29 a pulse whose duration is equal to the difference itself. That pulse, arriving at wire 5 through OR gate PD3, contributes to lower the oscillation frequency of the signal on wire 2.

As previously mentioned, monostable circuit M2, together with AND gates PU2 and PD2, carries out the same corrections by evaluating the duration of logic level "1" on wire 25, obtained by inverting the signal on wire 24 by means of I1. The pulse intended to increasing the oscillation frequency of the signal on wire 2 is supplied by PU2 on wire 30 and it passes to wire 4 through OR gate PU3, whilst the pulse intended to decrease said frequency is supplied by PD2 on wire 31 and it passes on wire 5 through OR gate PD3. The use of a duplicated structure, which utilises both the information contained in the duration of logic level "1" and that contained in the duration of logic level "0", allows the PLL to converge to the locked situation faster.

Figure 3:
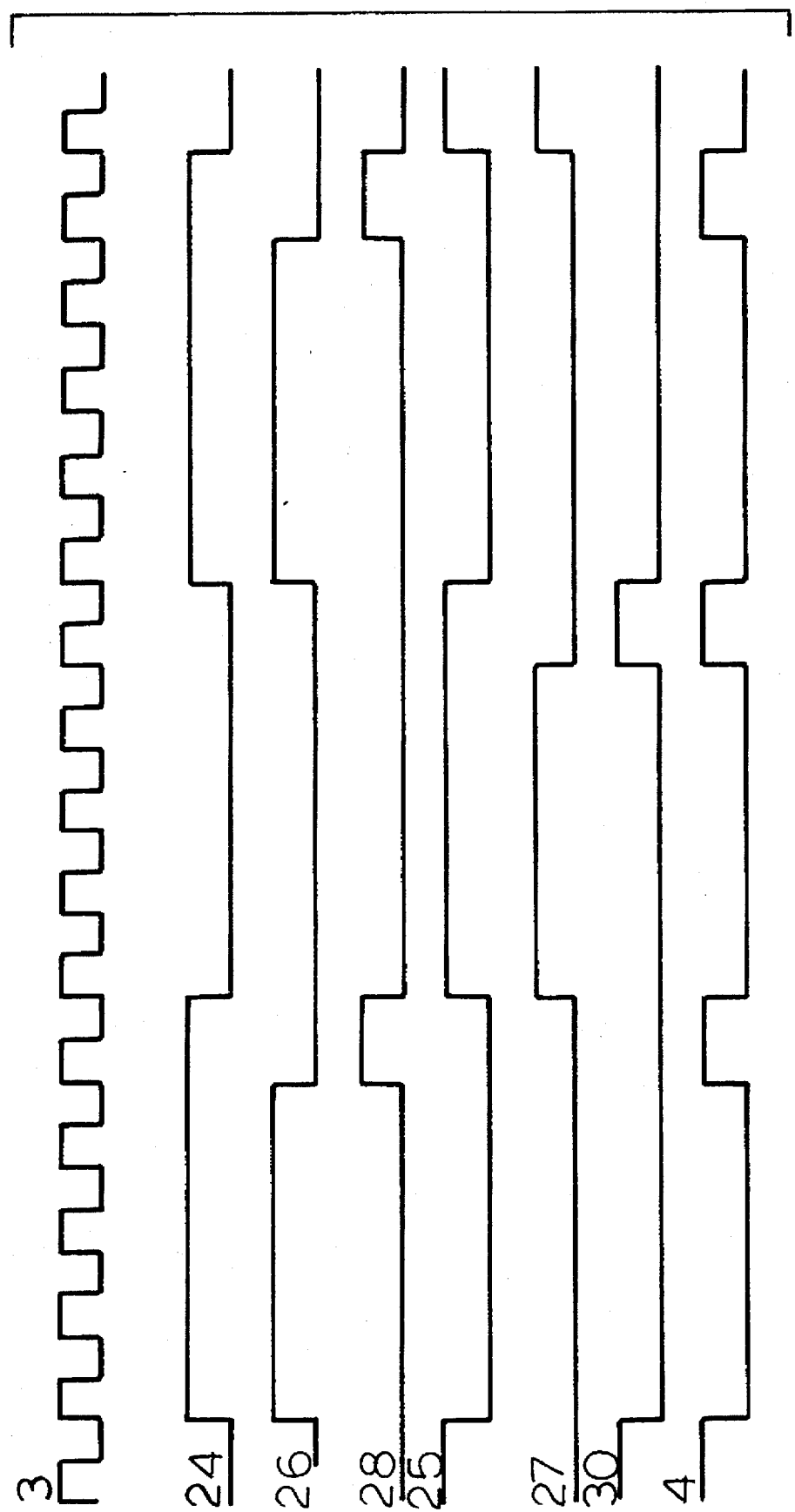
FIG. 3 is a time diagram related to the operation of block DFR in FIG. 2.

FIG. 3 depicts a time diagram related to the operation of frequency detector DFR. In the Figure every waveform is indicated by the same reference number used to identify the related wire in the previous Figures. The example shown refers to a situation in which the oscillation frequency at the output of the VCO is lower than the operating frequency.

If the frequency difference was lower than the one illustrated in the Figure, the correction pulses present on wire 4 would maintain the same duration but would be less frequent in time.

Figure 4:
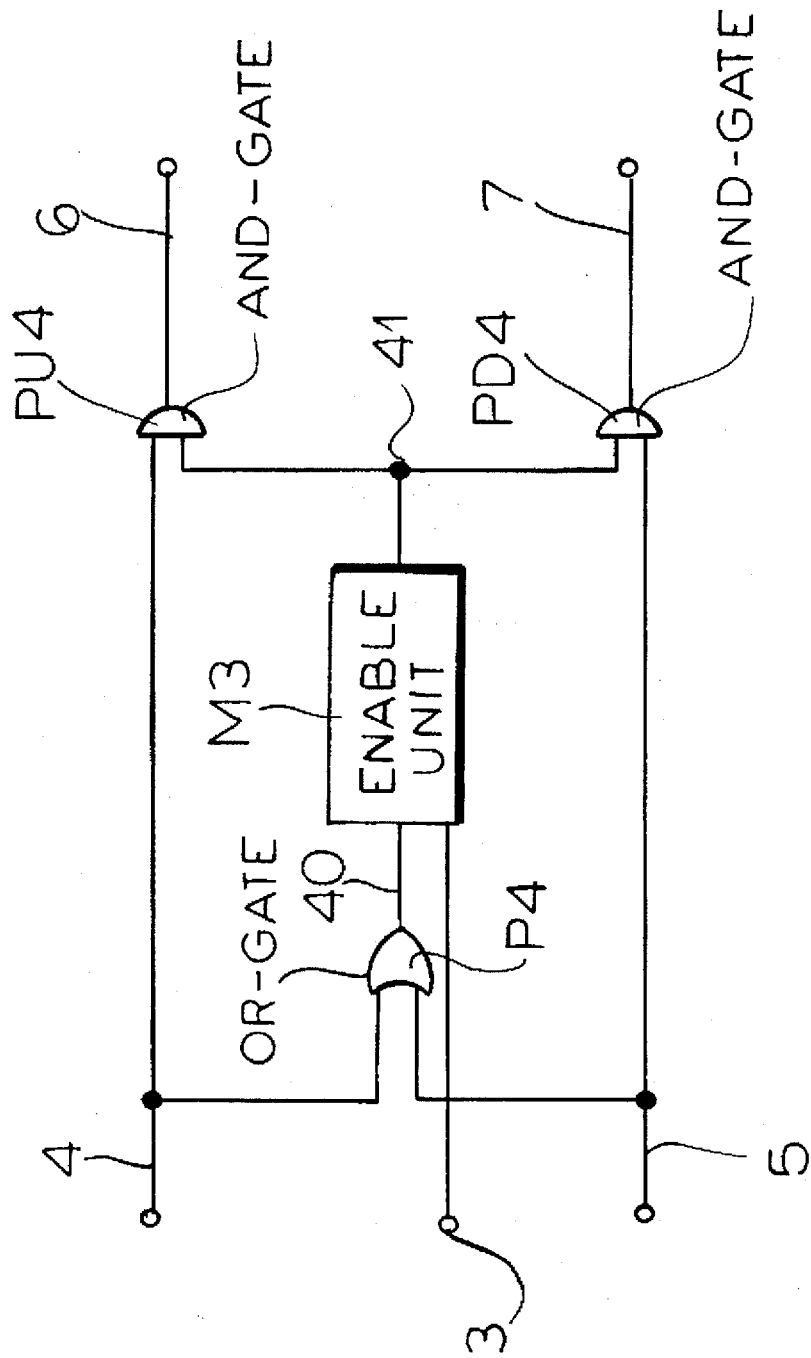
FIG. 4 is a block diagram of block CS of FIG. 1.

FIG. 4 illustrates the block diagram of threshold comparator CS.

CS is to disable correction by frequency detector DFR (FIG. 1) when the oscillating frequency at the output of the VCO has entered the range of the main loop carrying out the phase locking. Conversely, as soon as the difference in frequency exceeds a pre-defined value, the threshold comparator will enable again the secondary loop operation.

The main element of the detector is block M3 which, in the presence of an incoming pulse on wire 40, supplies on wire 41 a pulse whose duration is equal to a number N of cycles of the incoming clock signal on wire 3, for example 256 cycles. The signal on wire 41 causes gates PU4 and PD4 to open and close, thereby enabling and disabling secondary loop operation. If an incoming pulse arrives on wire 40 while the signal on wire 41 is active, then the duration of the pulse on wire 41 is increased in order to keep the pulse active for N cycles starting from the last pulse that has arrived.

A pulse on wire 4, or on wire 5, passes through OR gate P4 enabling operation of block M3, which enables the opening of the two gates PU4 and PD4. A subsequent pulse on wire 4, or on wire 5, can be transferred through gate PU4 or PD4, respectively, to wire 6 or 7, if it arrives within the enabling interval provided by the signal on wire 41, otherwise it is blocked.

It is evident that what has been described is provided solely by way of non-limiting example. Variations and modifications are possible without departing from the scope of the claims.

I claim:

1. A circuit for clock signal extraction from a high speed data stream comprising:

a main phase locked loop, comprising of phase detector, a driven current generator, a filter and a voltage controlled oscillator, in which the phase detector compares the phase of a data signal with that of a locally generated clock signal and generates an error signal which, through the driven current generator and the filter, controls the voltage controlled oscillator by continually controlling its phase;

a secondary loop, which allows the main loop to become locked by bringing the voltage controlled oscillator to oscillate at a frequency close to an operating frequency, said secondary loop comprising a frequency detector, a threshold comparator and a driven current generator which feeds said filter, the frequency detector comprising:

a first divider which divides the locally generated clock signal;

a sampling block which synchronizes a signal supplied by the first divider with a reference signal;

a second divider which divides a signal supplied by the sampling block;

a first monostable circuit which generates output pulses of a duration determined on the basis of the reference signal and whose starting instant is determined by the transitions of a signal supplied by the second divider;

a second monostable circuit which generates output pulses of duration determined on the basis of the reference signal and whose starting instant is determined by the transitions of a signal supplied by the second divider;

a second monostable circuit which generates output pulses of a duration determined on the basis of the reference signal and whose starting instant is determined by the transitions of a signal obtained by inverting the signal supplied by the second divider;

a first AND gate which receives the signal supplied by the second divider and a complement of a signal supplied by the first monostable circuit;

a second AND gate which receives a complement of the signal supplied by the second divider and the signal supplied by the first monostable circuit;

a third AND gate which receives the complement of the signal supplied by the second divider and the complement of a signal supplied by the second monostable circuit;

a fourth AND gate which receives the signal supplied by the second divider and the signal supplied by the second monostable circuit;

a first OR gate which receives a signal supplied by the first AND gate and a signal supplied by the third AND gate and supplies pulses whose frequency and duration are proportional to a frequency error, when the frequency of the locally generated clock signal is lower than that of the reference signal; and a second OR gate which receives a signal supplied by the second AND gate and a signal supplied by the fourth AND gate and supplies pulses whose frequency and duration are proportional the frequency error, when the frequency of the locally generated clock signal is higher than that of the reference signal.

2. The circuit for clock signal extraction from a high speed data stream as defined in claim 1 wherein said threshold comparator comprises:

a third OR gate which receives pulses supplied by said first and second OR gates;

an enable block which generates a pulse of a duration equal to some cycles of the reference signal every time it receives at an input thereof a pulse supplied by the third OR gate; and a fifth and a sixth AND gates which allow the pulses supplied by said first and second OR gates to pass to respective outputs when enabled by the pulse generated by said enable block, to feed said driven current generator of said secondary loop.

* * * * *